United States Patent
Segawa et al.

(10) Patent No.: US 6,598,292 B1
(45) Date of Patent: Jul. 29, 2003

(54) METHOD OF MANUFACTURING A CIRCUIT BOARD USING A POROUS SHEET COMPOSED OF CELLULOSE

(75) Inventors: Shigetoshi Segawa, Ehime (JP); Yasuyuki Baba, Ehime (JP); Katsuyoshi Ishikawa, Ehime (JP); Kazuhiko Ihara, Ehime (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/554,395

(22) PCT Filed: Oct. 7, 1999

(86) PCT No.: PCT/JP99/05530
§ 371 (c)(1),
(2), (4) Date: Jul. 13, 2000

(87) PCT Pub. No.: WO00/21347
PCT Pub. Date: Apr. 13, 2000

(30) Foreign Application Priority Data

Oct. 7, 1998 (JP) ............................................. 10-285195

(51) Int. Cl.[7] ................................................. H01K 3/10
(52) U.S. Cl. ............................ 29/852; 29/825; 29/846; 228/256; 228/258; 101/126; 101/129
(58) Field of Search .......................... 29/825, 846, 852; 228/256–262; 428/450, 97, 99; 174/261; 101/126, 123, 124, 129

(56) References Cited

U.S. PATENT DOCUMENTS 4,323,593 A * 4/1982 Tsunashima ................. 427/97
5,277,761 A * 1/1994 Van Phan et al. ............ 162/109
5,323,701 A * 6/1994 Sommer ....................... 101/126
5,821,179 A * 10/1998 Masaki et al. ............... 442/375

FOREIGN PATENT DOCUMENTS

| EP | 0555669 | 1/1993 |
| FR | 2714567 | 12/1993 |
| JP | 02302094 | 12/1990 |
| JP | 03120791 | 5/1991 |
| JP | 06039998 | 2/1994 |
| JP | 07030256 | 1/1995 |
| JP | 08191184 | 7/1996 |

OTHER PUBLICATIONS

Japanese search report for PCT/JP99/05530 dated Jan. 31, 2000.

* cited by examiner

*Primary Examiner*—Richard Chang
(74) *Attorney, Agent, or Firm*—RatnerPrestia

(57) ABSTRACT

A manufacturing method of a circuit board comprises the steps of: (a) feeding a printing stage having a porous member comprising a porous plate and a porous sheet, the porous sheet is composed of 90 wt % to 98 wt % of cellulose; (b) placing a plate for the circuit board having a pierced hole above the porous member; and (c) filling a conductive material in the pierced hole from an upper side of the plate for circuit board by sucking the porous member at a prescribed vacuum pressure from a back of the porous member.

10 Claims, 4 Drawing Sheets

METHOD OF MANUFACTURING A CIRCUIT BOARD USING A POROUS SHEET COMPOSED OF CELLULOSE

This Application is a U.S. National Phase Application of PCT International Application PCT/JP99/05530.

TECHNICAL FIELD

The present invention relates to a manufacturing method of circuit board and a porous sheet, more specifically a manufacturing method of circuit board comprising a process of filling a conductive material in pierced holes of the, plate for circuit board, a manufacturing apparatus and a porous sheet used for it.

BACKGROUND ART

A manufacturing method of circuit board has a process of forming pierced holes (through holes) in said plate serving as base material of circuit board and a printing process for printing conductive material on that plate. This printing process comprises a process of forming a conductive layer of prescribed pattern on the surface of said plate, and a process of filling a conductive material in said pierced holes (metallizing process) to ensure electric continuity between the both surfaces of said plate. Conventionally, for filling the conductive material sufficiently in the pierced holes in the latter metallizing process, the plate for circuit board was placed on the printing stage and, while the pierced holes in the plate were vacuum sucked, the conductive material was filled in the pierced holes. FIG. 4 indicates that conventional method. As shown in FIG. 4, air intake ports 37 are formed on a printing stage 32, and the air intake ports 37 have holes slightly larger than the pierced holes 36. At the position where the air intake ports 37 correspond to the pierced holes 36, a plate 31 for circuit board is placed on the printing stage 32. In this state, vacuum suction is performed from under the printing stage 32. With this Vacuum suction, the air in the pierced holes 36 is sucked through these air intake ports 37. In this state, the conductive material 35 put on a screen mesh 33 placed on the plate 31 for circuit board is screen printed. In the screen process printing, the conductive material 35 is printed inside the pierced holes 36 through a screen mesh 33 by means of a squeegee 34. As a result of this screen process printing, the conductive material 35 is filled in the pierced holes 36.

However, in the conventional printing process described above, each time when the position of pierced holes 36 in the plate 31 for circuit board changes, the position of the air intake ports 37 in the printing stage 32 must also be changed. For that reason, the manufacturing cost of the printing stage 32 becomes high. Moreover, in said conventional method, part of the conductive material 35 filled in the pierced holes 36 moves into the air intake ports 37. For that reason, as the number of times of printing process increases, the conductive material 35 gradually accumulates in the air intake ports 37. When the number of times of printing process further increased, the conductive material 35 also passed to the back side of the plate 31, producing a deposit of dirt there, and the conductive material 35 was transferred to the surrounding area on the bottom face side of the pierced holes 36 and, as a result, said method caused occurrence of short-circuit in the circuit board.

The present invention provides a manufacturing method of circuit board, not requiring any change of specifications of the printing stage at each change of specifications of the plate for circuit board nor producing any dirt on the back side of the plate for circuit board, and a porous sheet used it.

SUMMARY OF THE INVENTION

The manufacturing method of circuit board according to the present invention comprises:
  (a) a process of feeding a printing stage having a porous member permeable in the direction of thickness,
  (b) a process of placing a plate for circuit board having pierced holes above said porous member, and
  (c) a process of filling a conductive material in said pierced holes from the upper side of said plate for circuit board by sucking said porous member at prescribed vacuum pressure from the back side of said porous member.

The manufacturing apparatus of circuit board according to the present invention comprises a printing stage having a porous member permeable in the direction of thickness,
  a suction mechanism for sucking said porous member at prescribed vacuum pressure from the back side of said porous member, and
  a coating mechanism for coating a conductive material on said plate for circuit board placed on said printing stage, from the upper side of said printing stage,
  in which the plate for circuit board may be placed above said porous member, and
  makes it possible for said conductive material to be coated on the surface of said plate for circuit board from the upper side of said plate while said plate is being sucked as said porous member is vacuum sucked from the back face side of said printing stage.

Particularly preferably, said porous plate plays the role of said printing stage.

Particularly preferably, said porous member has a porous plate permeable in the direction of thickness and a porous sheet permeable in the direction of thickness placed on said porous plate, and said plate is placed on the upper side of said porous sheet.

Particularly preferably, said porous sheet is replaceable and, moreover, a process of replacing said porous sheet is provided.

Particularly preferably, said porous sheet contains cellulose in the range of approximately 90 wt % to approximately 98 wt %, and said cellulose contains softwood kraft pulp in the range of approximately 20 wt % to approximately 40 wt % and hardwood kraft pulp in the range of approximately 60 wt % to approximately 80 wt %.

With the construction described above, there is no more need of changing the specifications of porous plate and porous sheet as printing stage each time when the specifications of the plate for circuit board are changed, and it becomes possible to fill a conductive material easily in pierced holes of the base material for circuit board with different specifications. Furthermore, adhesion of conductive material and dirt to the back face of the plate for circuit board is prevented.

BEST MODE FOR CARRYING OUT THE INVENTION

Figure 1:
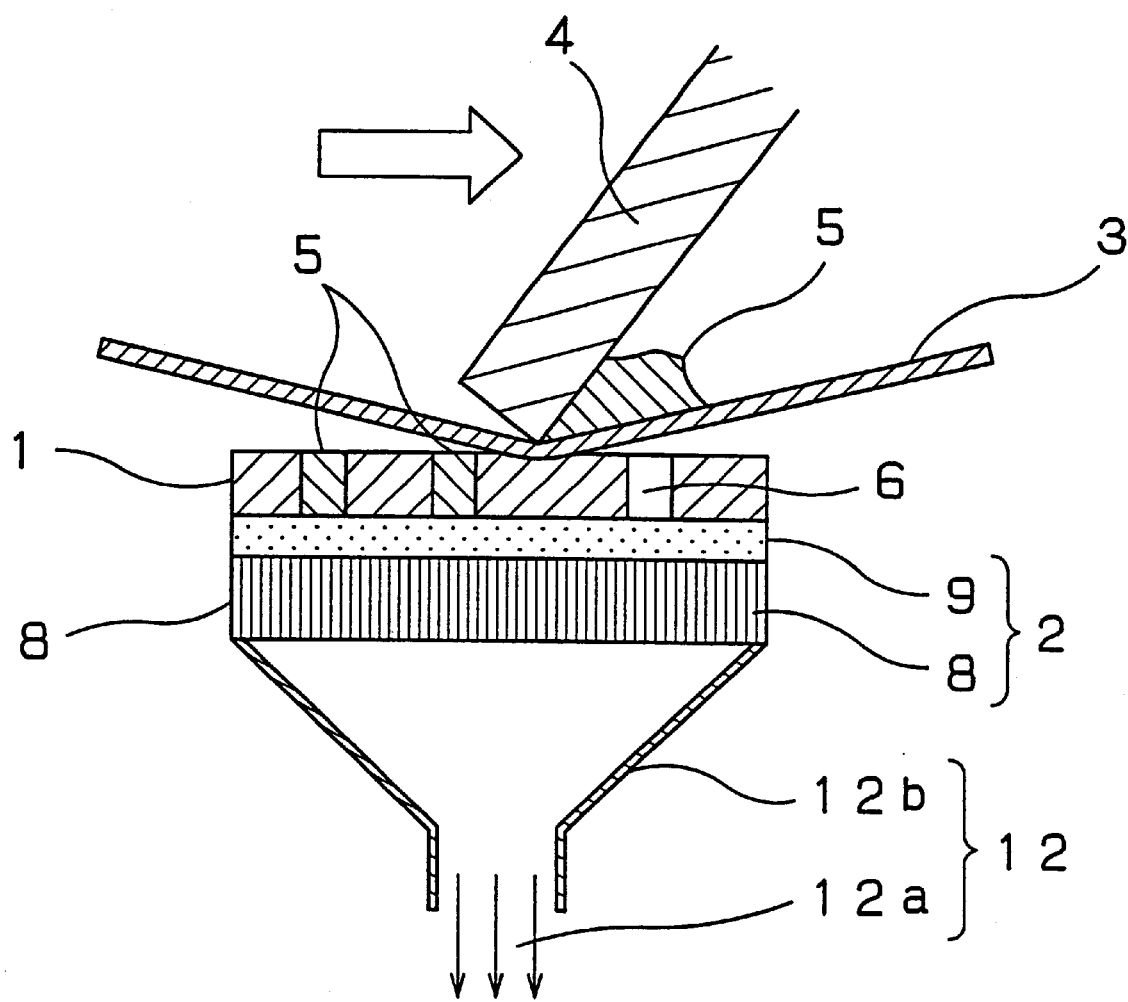
FIG. 1 is a partial sectional view showing the manufacturing apparatus of circuit board of an embodiment of the present invention.

Various studies were made and a variety of experiments were conducted and, as a result, the present invention was completed. Namely, an idea was conceived of constituting the printing stage with a porous plate having mechanical strength and a porous sheet having accurate surface, and it was also confirmed that use of specific cellulosic sheet as porous sheet is preferable.

An embodiment of the manufacturing method of circuit board according to the present invention comprises a process of placing a plate for circuit board forming pierced holes on a printing stage and a process of filling a conductive material in said pierced holes from the surface side of the plate for circuit board through the printing stage from the back side of the printing stage.

The manufacturing apparatus of circuit board according to the present invention comprises a printing stage having a porous member permeable in the direction of thickness, a suction mechanism for sucking said porous member at prescribed vacuum pressure from the back side of said printing stage, and a coating mechanism for coating a conductive material on said plate for circuit board placed on said printing stage, from the upper side of said printing stage. The plate for circuit board can be placed above said porous member, and said conductive material can be coated on the surface of said plate for circuit board from the upper side of said plate for circuit board.

Particularly preferably, said porous member plays the role of a printing stage.

Particularly preferably, the printing stage has a porous member. That porous member has a porous plate and a porous sheet, and is constructed as the porous sheet is placed on the porous plate. Moreover, particularly preferably, said porous sheet contains cellulosic sheet. That cellulosic sheet contains 20 to 40 wt % of softwood kraft pulp and 60 to 80 wt % of hardwood kraft pulp. Furthermore, that cellulose represents 90 to 98 wt % of the entire cellulosic sheet.

In the printing method of this embodiment, the printing stage comprises a porous plate having a strong mechanical strength sufficient for holding the plate for circuit board and a porous sheet having accurate surface placed on it.

The porous plate, obtained by working powdery material, has such property that a plurality of voids formed among the powdery material enable ventilation in the direction of thickness. For example, the porous plate is constituted, at least, with a sintered metal plate or a porous ceramic plate, etc. and has a thickness of approximately 1 mm to approximately 10 mm. That porous plate has a structure enabling passage of gas in the direction of thickness, at portions where the plate for circuit board is supported. For example, that porous plate has continuous pierced holes passing through from surface to back face. The sintered metal plate or porous ceramic plate has continuous ultrafine pores. Moreover, that porous plate has mechanical strength for protection against cracking or breaking due to suction force of vacuum suction, in the state in which the plate for circuit board is supported.

The porous sheet has a thickness of approximately 20 $\mu$m to approximately 80 $\mu$m, for example. That porous sheet is porous, at least, on the entire area of the portion at which it is in contact with the plate for circuit board, and has a structure enabling passage of gas in the direction of thickness at all positions facing the plate for circuit board. Namely, the porous sheet has air permeability. That porous sheet has an accurate surface and, for that reason, is finished smooth at the portion of pierced holes which gets in contact with the surface of the circuit board. In that case, as degree of accuracy, a density of approximately 0.3 g/cm$^3$ to approximately 0.8 g/cm$^3$ is desirable. Furthermore, in the case where the specific gravity of the pulp is supposed to be approximately 1, the porous sheet shall preferably have a porosity in the range from approximately 0.3 to approximately 0.8, considering the density. In the case where the density is no higher than 0.3 g/cm$^3$, the surface roughness of the porous sheet gets higher, having bad influences on the circuit board. In the case of a density no less than approximately 0.8 g/cm$^3$, the air permeability of the porous sheet gets low.

The porous sheet used in this embodiment will be described concretely hereafter. This porous sheet contains 90 to 98 wt % of cellulose. That cellulose contains approximately 20 to approximately 40 wt % of softwood kraft pulp and approximately 60 to approximately 80 wt % of hardwood kraft pulp. In the case where the cellulose content in the porous sheet is no higher than 90 wt %, the tensile strength of the sheet becomes weak. On the other hand, in the case where the cellulose content is no lower than 98 wt %, the flexibility diminishes, and a construction containing at least one of water content and additive as component other than cellulose in the porous sheet is also possible. As additive, polyethylene oxide, etc. may be used, for example.

The raw material of the cellulose in this embodiment will be described hereafter. This cellulose has an advantage of providing a porous sheet with sufficient strength and little production of fiber refuse as the proportion of softwood pulp content increases. However, in the case where the proportion of softwood pulp is higher than the range mentioned above (approximately 40 wt %), the smoothness of the surface gets poorer and, for that reason, the degree of contact between the pierced hole portion of the plate for circuit board and the porous sheet becomes variable. As a result, variations of suction force are produced, causing defective filling of the conductive material to be filled in the pierced holes. On, the other hand, as the proportion of hardwood pulp content increases, the absorbability of the conductive material sucked by the porous sheet improves, providing porous sheet with excellent surface smoothness. However, in the case where the proportion of hardwood pulp is higher than the range mentioned above (approximately 80 wt %), the air permeability tends to drop. As a result, the suction force becomes weaker, to eventually produce a large amount of fiber refuse. In this way, defective filling comes to be produced easily. For that reason, in the case where an ordinary toilet paper is used, for example, a large amount of dust and fiber refuse coming out of this paper clogs the pierced holes, eventually leading to frequent production of defective filling. On the other hand, in the case of use of high-quality paper, the conductive material cannot be absorbed well because of a drop of air permeability.

In the case where a printing stage having porous plate and porous sheet is sucked from its back face side, the plate for circuit board is subject to a suction force through those porous plate and porous sheet. Moreover, even in the case where the position and dimensions of pierced holes in the plate for circuit board changed with some change of product specifications, it becomes possible for the plate for circuit board to be submitted to a suction force, through those porous plate and porous sheet, without being influenced by such change of product specifications. Namely, the printing stage used in this embodiment does not require any suction hole of prescribed shape. The printing stage used in this embodiment, which does not have any suction hole of prescribed shape, prevents accumulation of conductive material in such holes and on the back face. In a printing process placed under such state of vacuum suction, there are cases where part of the conductive material filled in the pierced holes adheres to the porous sheet but, in that case, only the porous sheet is replaced, at a proper point in time when the number of times of printing progressed. With this porous sheet only, it becomes possible to prevent transfer of such deposit to the plate for circuit board.

The manufacturing method of circuit board of this embodiment comprises a process of placing a plate for circuit board forming pierced holes on the printing stage and a process of filling a conductive material in said pierced holes from the surface side of the plate for circuit board while sucking said plate for circuit board from the back side of that printing stage.

In this method, ceramic green sheet, organic resin base material or metal substrate, etc. are used, for example, as plate for circuit board.

As conductive material, an ordinary conductive material is used. For example, a conductive material is composed of a main component of metal powder such as Cu, Ag, Au, W, Mo, etc., a binder such as ethyle cellulose, etc. and a solvent such as terpineol, etc. The proportion of blending of those component elements is approximately 70 to approximately 95 wt % of metal powder and approximately 30 to approximately 5 wt % of binder and solvent components, for example.

As for the method of filling conductive material in the pierced holes, such method as screen printing method or metal mask printing method, etc. are used.

As suction pressure (degree of vacuum), a range from approximately 100 to approximately 500 mmHg is preferable, for example. In the case where the sucion pressure is no higher than approximately 100 mmHg, the conductive material may not be filled sufficiently in the pierced holes. In the case of a sucion pressure no lower than approximately 500 mmHg, there is a risk of producing a void or depression at the center of the pierced holes.

Exemplary Embodiment

Figure 2:
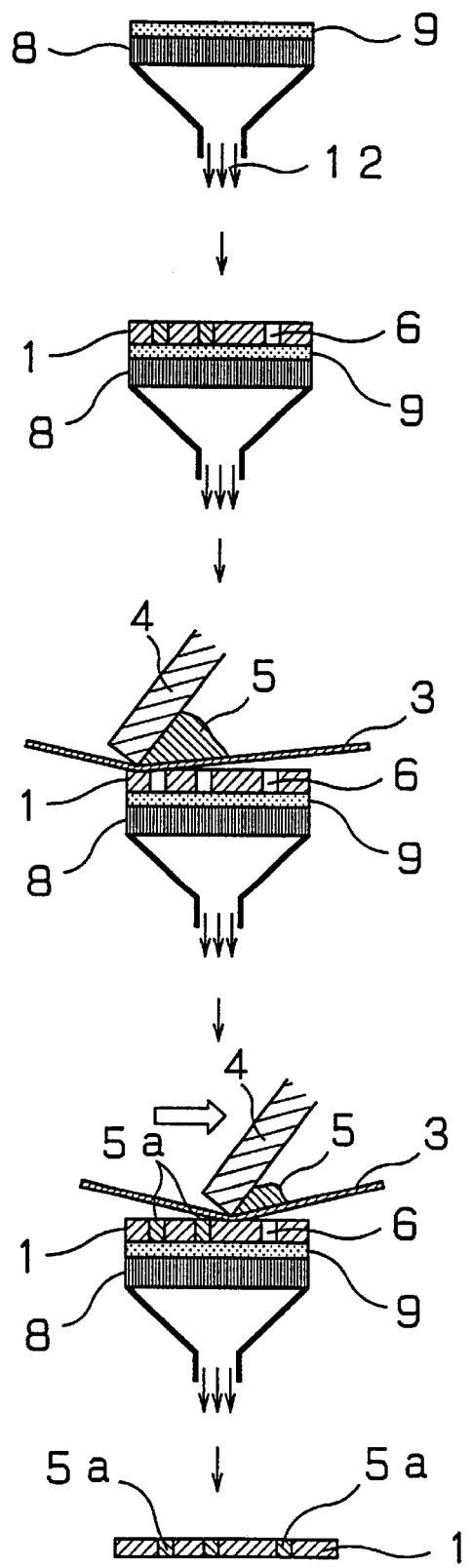
FIG. 2 indicates a sectional view showing the manufacturing process in an embodiment of the manufacturing method of circuit board according to the present invention.
Figure 3:
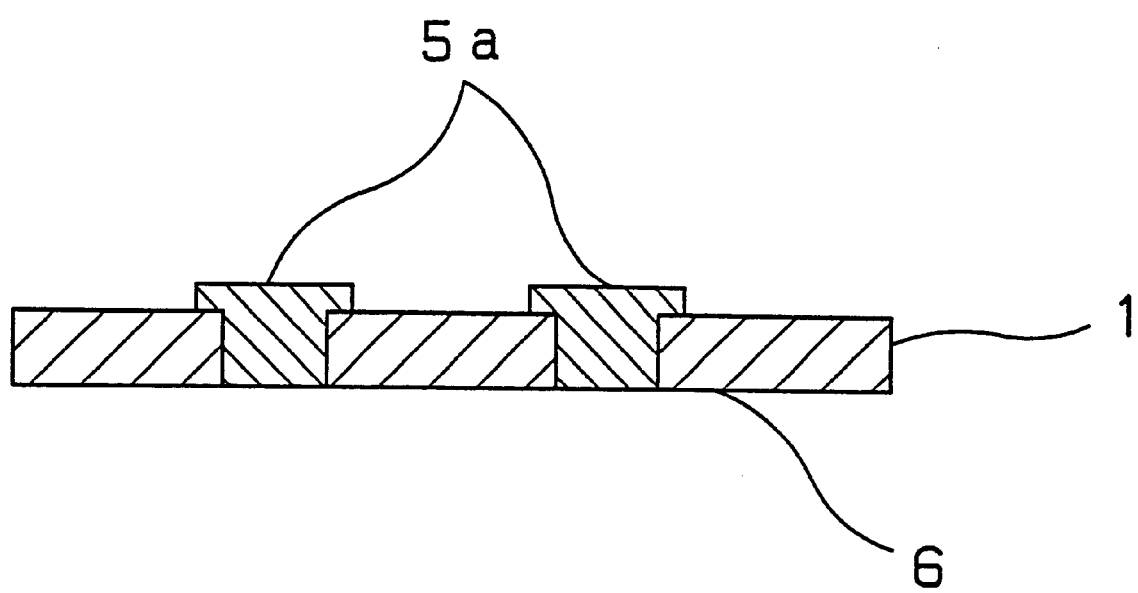
FIG. 3 indicates a sectional view showing the state in which a conductive material is filled in the pierced holes of a plate for circuit board.
Figure 4:
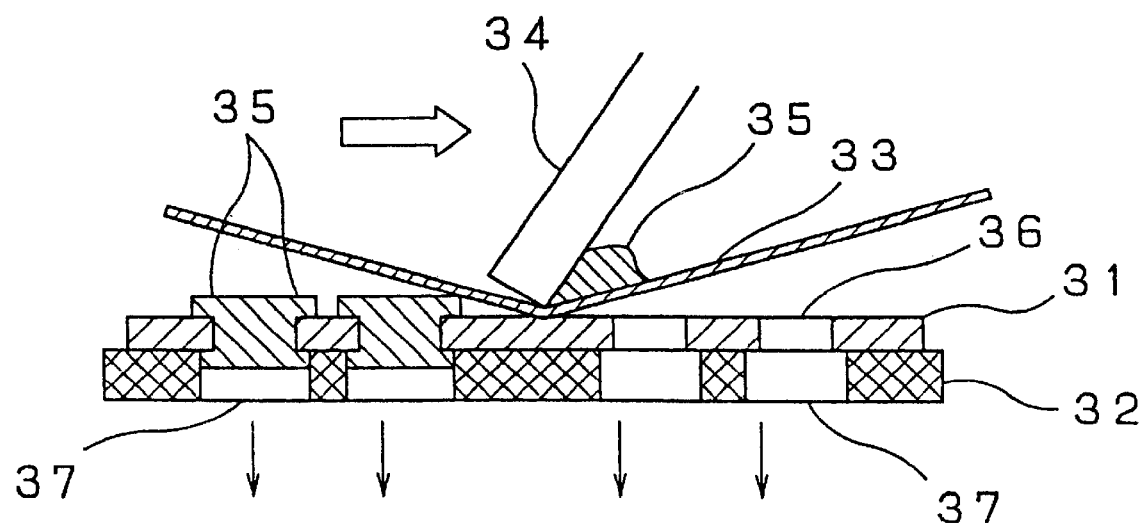
FIG. 4 indicates a partial side sectional view showing the conventional printing method.

An exemplary embodiment of the manufacturing method of circuit board according to the present invention, manufacturing apparatus for it and porous sheet used in that manufacturing method will be explained concretely hereafter with reference to drawings. FIG. 1 indicates an apparatus for coating a conductive material on a plate for circuit board. FIG. 2 indicates a process of filling the conductive material in pierced holes of the plate for circuit board. FIG. 3 indicates the state in which the conductive material is filled in the pierced holes.

In FIG. 1 and FIG. 2, the printing stage 2 has a porous plate 8 and a porous sheet 9. The porous plate 8 has a mechanical strength sufficient for holding the plate for circuit board, is made by sintering metal particles of particle size 40 mm, and is a sintered metal plate with a thickness of 2.0 mm. The porous sheet 9 is a paper containing 95 wt % of cellulose and water content. Said cellulose has 30 wt % of softwood kraft pulp and 70 wt % of hardwood kraft pulp. The surface roughness of the porous sheet 9 is 30 sec/surface (value obtained by the test method of JIS-P 8119). The thickness of the porous sheet 9 is 50 mm.

On this porous sheet 9 was placed a plate for circuit board 1 forming pierced holes 6 with a diameter of 0.15 mm. This plate for circuit board 1 consists of a green sheet of a thickness of 200 $\mu$m. Green sheet means sinterable sheet composed of ceramic powder and a binder.

On the back side of the porous plate 8 is provided a suction mechanism 12. The suction mechanism 12 has a vacuum pump 12a and a wind tunnel 12b installed on the back face side of the printing stage 2. The conductive material 5 was printed and filled in the pierced holes 6 through the screen mesh 3 by sliding the squeegee (skid) 4, while performing vacuum suction at a pressure of 300 mmHg from the back side of the plate for circuit board 1. Namely, the conductive material 5 was filled in the pierced holes 6, by the screen process printing method in the state of vacuum suction. The conductive material 5 consists of a Ag paste having 80 wt % of Ag and 20 wt % of binder and solvent. At that time, a suction force which passed through the porous plate 8 and the porous sheet 9 works on the pierced holes 6 and, by that suction force, the conductive material 5a is filled adequately into the pierced holes 6. And yet, the filled conductive material 5 no longer turned to the back side of the plate for circuit board 1, and no foreign matters or dirt, etc. adhered to the back face of the plate for circuit board 1. The filled conductive material 5a does not contain any air bubbles.

Next, on the green sheet 1, the pierced holes 6 of which are filled with the conductive material 5a, was coated a Ag paste containing silver powder, and prescribed inner layer circuit was formed. Green sheets having various inner layer circuits were prepared with repetition of such processes, and by using different green sheets. 6 green sheets 1 having this inner layer circuit are put one upon another, and hot pressed at a temperature of 100° C. and a pressure of 100 kg/cm². A layered product obtained this way was submitted to a binder removing treatment for 2 hours at 400° C. and then sintered for an hour at 900° C. Lastly, on the outermost layer of this sintered body was formed a prescribed outermost layer pattern with Ag/Pd paste containing silver powder and lead powder, and then sintered at a temperature of 850° C. A circuit board was completed in this manner.

Industrial Applicability

With the construction of the present invention, there is no more need of changing the specifications of porous plate and porous sheet as printing stage each time when the specifications of the plate for circuit board are changed, and it becomes possible to fill conductive material in the pierced holes of plates for circuit board having different specifications easily, by means of a set of specifications of porous plate and porous sheet. Moreover, adhesion of conductive material and dirt to the back face of the plate for circuit board is prevented.

What is claimed is:

1. A manufacturing method of a circuit board comprising the steps of:
   (a) feeding a printing stage having a porous member comprising a porous plate and a porous sheet, said porous sheet is composed of 90 wt % to 98 wt % of cellulose;
   (b) placing a plate for the circuit board having a pierced hole above said porous member; and
   (c) filling a conductive material in said pierced hole from an upper side of said plate for said circuit board by sucking said porous member at a prescribed vacuum pressure from a back of said porous member.

2. The manufacturing method of circuit board as defined in claim 1, further comprising a step of replacing said porous sheet to another porous sheet.

3. The manufacturing method of circuit board as defined in claim 1, wherein said porous sheet is a cellulose sheet containing softwood kraft pulp and hardwood kraft pulp.

4. The manufacturing method of circuit board as defined in claim 1, wherein said porous sheet is a cellulose sheet containing 20 wt % to 40 wt % of softwood kraft pulp and 60 wt % to 80 wt % of hardwood kraft pulp.

5. The manufacturing method of circuit board as defined in claim 1, wherein said porous plate is obtained by working powdery material, and a plurality of voids formed among the powdery material enable ventilation in the direction of thickness.

6. The manufacturing method of circuit board as defined in claim 1, wherein said porous plate is one of a metal sintered body obtained by sintering metal powder and a porous ceramic plate.

7. The manufacturing method of circuit board as defined in claim 1, wherein said porous sheet has a thickness of 20 $\mu$m to 80 $\mu$m, and said porous plate has a thickness of 1 mm to 10 mm.

8. The manufacturing method of circuit board as defined in claim 1, wherein the vacuum pressure for sucking said porous member is in a range from 100 mmHg to 500 mmHg.

9. The manufacturing method of circuit board as defined in claim 1, wherein said porous sheet has a density of 0.3 g/cm$^3$ to 0.8 g/cm$^3$.

10. The manufacturing method of circuit board as defined in claim 1, wherein said conductive material is filled in said pierced hole by at least one method of screen printing method and metal mask printing method.

* * * * *